(12) United States Patent
Tanaka et al.

(10) Patent No.: US 7,381,968 B2
(45) Date of Patent: Jun. 3, 2008

(54) CHARGED PARTICLE BEAM APPARATUS AND SPECIMEN HOLDER

(75) Inventors: Hiroyuki Tanaka, Hitachinaka (JP); Mitsugu Sato, Hitachinaka (JP); Masashi Sasaki, Mito (JP); Yoshifumi Taniguchi, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 257 days.

(21) Appl. No.: 11/105,584

(22) Filed: Apr. 14, 2005

(65) Prior Publication Data

US 2005/0230636 A1    Oct. 20, 2005

(30) Foreign Application Priority Data

Apr. 16, 2004  (JP) ............................... 2004-122094

(51) Int. Cl.
*G21K 5/10* (2006.01)
*G21K 5/08* (2006.01)

(52) U.S. Cl. ..................... 250/440.11; 250/441.11; 250/310

(58) Field of Classification Search ........... 250/440.11, 250/442.11, 441.11, 310
See application file for complete search history.

(56) References Cited

U.S. PATENT DOCUMENTS

| 5,481,111 A | * | 1/1996 | Rosar et al. ................. 250/311 |
| 5,753,924 A | * | 5/1998 | Swann ..................... 250/443.1 |
| 5,783,830 A | * | 7/1998 | Hirose et al. .......... 250/492.21 |

FOREIGN PATENT DOCUMENTS

| JP | 11-258130 | 9/1999 |
| JP | 2001-291483 | 10/2001 |

* cited by examiner

*Primary Examiner*—David A. Vanore
(74) *Attorney, Agent, or Firm*—McDermott Will & Emery LLP

(57) ABSTRACT

Information of a specimen holder or information of a specimen mounted on the specimen holder is stored in a memory inside the specimen holder mounted to an electron microscope. The memory is accessed to transmit the information of the specimen holder to the electron microscope, thereby ensuring that the user can use the specimen holder without mistaking characteristics of the specimen holder and danger of erroneous recording of the specimen information can be reduced.

10 Claims, 11 Drawing Sheets

CHARGED PARTICLE BEAM APPARATUS AND SPECIMEN HOLDER

BACKGROUND OF THE INVENTION

The present invention relates to a charged particle beam apparatus such as electron microscope and focused ion beam apparatus and a specimen holder used in the charged particle beam apparatus.

In the case of a specimen holder for use in a conventional electron microscope, its size and function must be recognized by a user so that the user may operate the electron microscope in compliance with the holder. In addition, the user must memorize individually pieces of information of specimens mounted or carried on the specimen holder. JP-A-11-258130 (Patent Document 1) describes that a character or mark for identifying a specimen is inscribed on a specimen holder.

Further, JP-A-2001-291483 (Patent Document 2) describes that a memory means is provided in a cartridge mounted to a specimen holder and pieces of information concerning a portion to be worked and a portion to be observed are stored in the memory means.

SUMMARY OF THE INVENTION

Neither Patent Document 1 nor Patent Document 2 takes into account a case that the specimen holder differs in kind or type, that a specimen mounted on a specimen holder has different levels of height or that a plurality of specimens are mounted on a single specimen holder and for this reason, techniques of these references are not practical.

An object of the present invention is to provide an electron microscope which can automatically acquire pieces of information concerning differences in specimen holders and concerning specimens mounted on the specimen holders, these information pieces being decided by dint of recognition and memory by the user in the conventional method, so as to ensure more efficient operation.

According to this invention, a memory unit is mounted to a specimen holder. Data inherent in the specimen holder, data of a specimen set on the specimen holder at present or information of a position observed for the last time is stored in the memory unit.

More specifically, according to the present invention, in a charged particle beam apparatus having a specimen stage, a charged particle beam illumination system for irradiating a charged particle beam on a specimen mounted on a specimen holder borne by the specimen stage and a specimen fine movement mechanism for finely moving the position or posture of the specimen, the apparatus comprises a specimen holder communication system for accessing a memory the specimen holder borne by the specimen stage has and reading and/or writing information from/to the memory.

In the charged particle beam apparatus of this invention, a restriction imposed on the movement of a specimen to be effected by the specimen fine movement mechanism can be set through the use of, for example, information of the charged particle beam apparatus and information concerning the specimen holder and read out of the memory. Further, the apparatus can have the function to control the specimen fine movement mechanism in accordance with information of position and/or tilt angle read out of the memory. When the information of position and/or tilt angle corresponds to information concerning a preceding observation position, the same observation condition as that of the precedence can be reproducible with ease.

The memory built in a specimen holder according to this invention can have an area for storing information concerning the kind of the specimen holder and a mark for uniquely identifying the specimen holder (for example, a serial number) or information concerning a specimen mounted on the specimen holder. The memory may also have an area for storing information concerning positions observed or worked with the charged particle beam apparatus mounted with the specimen holder or information concerning tilt angles.

According to the present invention, changes in method of using the electron microscope or restrictions imposed on use thereof attributable to differences in specimen holders can be set by the electron microscope by itself to reduce erroneous operations by the user. Besides, pieces of information of a specimen mounted on the specimen holder can be totaled without resort to memory of the user.

A specimen holder for use in an electron microscope according to the present invention can store information of the specimen holder per se and information of a specimen mounted on the specimen holder and can transmit the information the specimen holder has to the electron microscope using it. Principally, a specimen holder for use in a transmission type electron microscope will be described hereinafter with reference to the accompanying drawings.

Other objects, features and advantages of the invention will become apparent from the following description of the embodiments of the invention taken in conjunction with the accompanying drawings.

DESCRIPTION OF THE EMBODIMENTS

Embodiment 1

Figure 8:
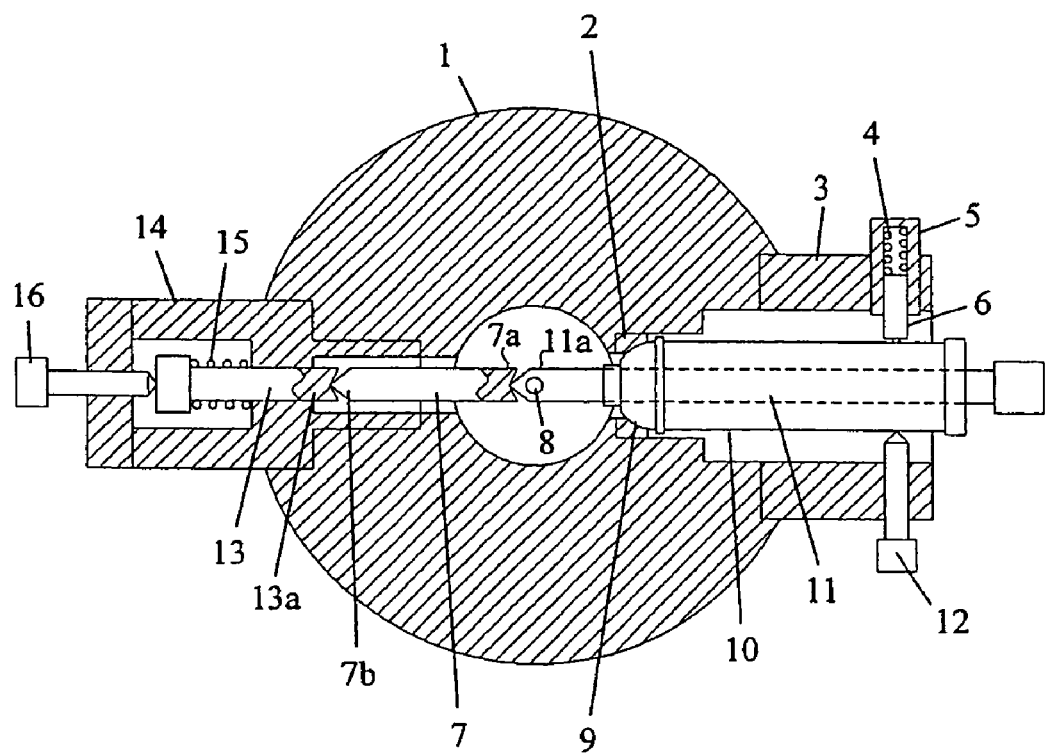
FIG. 8 is a cross-sectional schematic diagram showing an example of side entry type specimen movement mechanism of a transmission type electron microscope.

Referring now to FIG. 8, there is illustrated in sectional schematic diagram form an example of side entry type specimen fine movement mechanism of a transmission type electron microscope. A first faucet 3 is hermetically fixed to the side of a column 1 of the transmission type electron microscope. Housed in the first faucet 3 is a specimen stage 10. A specimen holder 11 is slidably and airtightly inserted in a hole formed axially and centrally of the specimen stage 10. The specimen holder 11 has an end 11a convexly shaped in triangular pyramid form at which a specimen 8 is mounted (hereinafter referred to as a specimen mounting end). The specimen stage 10 has a fore end integral with a spherical member 9 which is supported by a concavely spherical surface 2 formed in the column 1. The specimen stage 10 is pivotal on a fulcrum in the center of spherical member 9 to perform a gooseneck motion.

On the other hand, a second faucet 14 is hermetically fixed to the side of column 1 opposite to the first faucet 3. A shaft 13 is slidably and airtightly inserted in a conduit formed axially and internally of the second faucet 14 and the shaft 13 is conditioned to move axially by dint of a finely threaded screw 16 and a spring 15. The shaft 13 has one end 13a formed concavely conically and a rod 7 is clamped by means of the one end 13a of shaft 13 and the specimen mounting end 11a of specimen holder 11. The rod 7 has one end 7a formed concavely conically and the other end 7b convexly shaped in triangular pyramid form and the one end 7a of rod 7 cooperates with the specimen mounting end 11a of specimen holder 11 to provide a pivotal structure and the other end 7b of rod 7 cooperates with the one end 13a of shaft 13 to also provide a pivotal structure.

A thrust bar 6 is housed in a holder 5 embedded in part of the first faucet 3 and is constantly urged by tension force of a thrust spring 4 so as to bias the specimen stage 10 to the fore end of a finely threaded screw 12. The finely threaded screw 12 engages with a female screw threaded at a position opposing the thrust bar 6 in the first faucet 3, having its fore end in contact with the specimen stage 10.

With the construction as above, when the finely threaded screw 12 is turned in a direction, the specimen stage 10 is moved on a plane vertical to the optical axis. Though not illustrated, a fine thread screw equivalent to the fine thread screw 12 is mounted also in a direction vertical to the sheet of drawing and by turning it, the specimen stage 10 can be moved on a plane parallel to the optical axis. Since the opposite ends of the rod 7 is pivotally supported, the specimen stage 10 performs gooseneck motion on the fulcrum in the center of spherical member 9, thereby ensuring that the specimen 8 carried on the specimen holder 11 can be moved in arbitrary directions.

An electron beam is emitted from an electron gun and accelerated and is then focused by an illumination lens and an objective lens so as to be irradiated on the specimen 8 held by the specimen holder 11. The electron beam transmitting through the specimen is enlarged with the objective lens and an intermediate lens and is further enlarged with a projection lens to form a transmission image of the specimen on a scintillator. The scintillator converts the transmission electron image of the specimen into an optical image which in turn is photographed by an image pick-up device. A video signal from the image pick-up device is fetched into a CPU and is processed thereby to be displayed on a display unit. Generally, the specimen holder 11 for use in the transmission type electron microscope is pushed into the heart of the objective lens of transmission type electron microscope and is then used.

Figure 1:
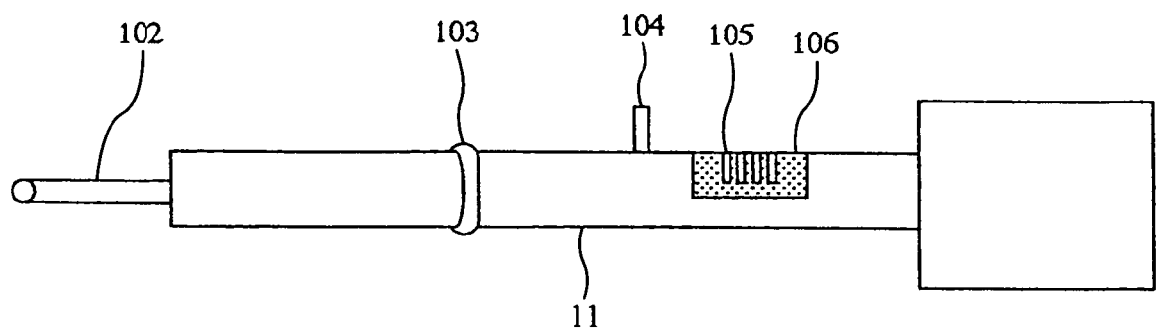
FIG. 1 is a diagram showing an example of schematic form of a specimen holder according to this invention.

Turning now to FIG. 1, there is illustrated an example of schematic shape of the specimen holder 11 according to this invention. A specimen is set at a specimen mount 102. Since the interior of the electron microscope is required to be kept in vacuum, an O-ring 103 is attached to a peripheral surface portion of the specimen holder 11. The specimen holder 11 has an insulating portion 106 in another peripheral surface portion and an electrode group 105 exposes to the insulating portion 106. Further, a stud 104 juts out of still another peripheral surface portion of specimen holder 11. The stud 104 pushes a micro-switch provided for the electron microscope proper to decide whether the specimen holder is mounted to the column.

Figure 2:
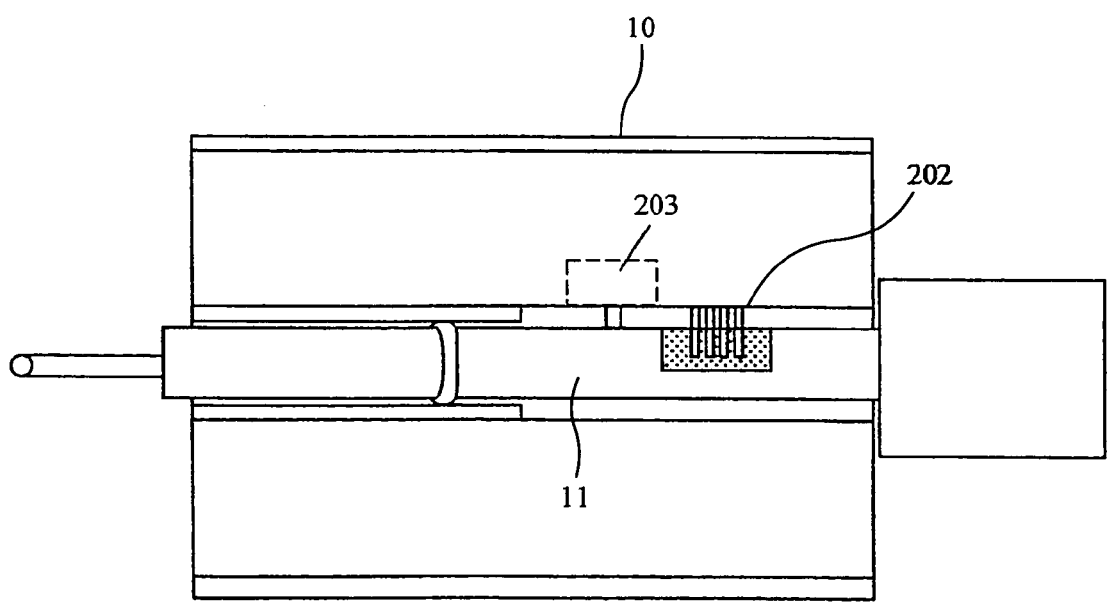
FIG. 2 is a diagram for explaining a specimen stage and the specimen holder.

The specimen holder 11 is mounted to the specimen stage 10 of electron microscope as schematically diagrammatically shown in FIG. 2. The specimen stage 10 into which the specimen holder is inserted is provided with a micro-switch 203 and an electrode group 202. The micro-switch 203 is used for detection of the specimen holder 11 and with the specimen holder 11 mounted to the specimen stage 10, the stud 104 operates to turn on the micro-switch. When the specimen holder 11 is properly pushed to a predetermined position of specimen stage 10, the electrode group 202 on the specimen stage side contacts the electrode group 105 on the side of specimen holder 11, thus completing an electrical connection.

Figure 3:
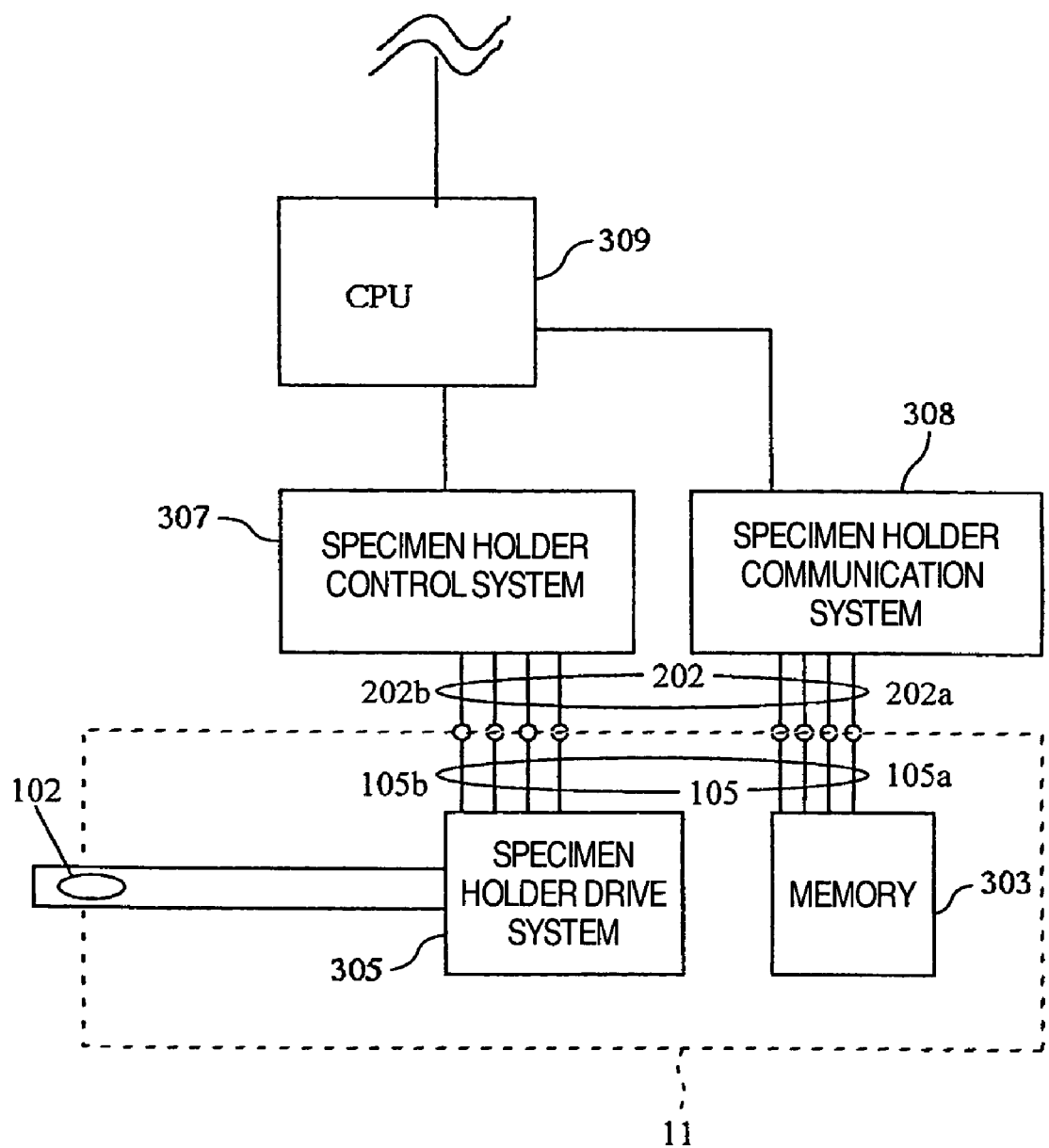
FIG. 3 is a schematic block diagram showing an electrical connection of the specimen holder to the specimen stage and an electron microscope proper.

The specimen holder is electrically connected to the specimen stage and the electron microscope proper as schematically illustrated in FIG. 3. Provided in the specimen holder 11 are a memory 303 and a specimen holder drive system 305 as well as electrodes 105a for connecting the memory 303 to an external circuit and electrodes 105b for inputting power and control signals to the specimen holder drive system 305. The electrode group 202 on the specimen stage side consists of two kinds of electrodes including electrodes 202a used for accessing the memory 303 installed in the specimen holder 11 through the electrodes 105a provided for the specimen holder 11 and electrodes 202b used for feeding power and control signals necessary for the specimen holder drive system 305. The electrodes 202a on the specimen stage side are connected to the electrodes 105a on the specimen holder side and the electrodes 202b on the specimen stage side are connected to the electrodes 105b on the specimen holder side.

Operational procedures are as follows. The specimen holder 11 is inserted into the specimen stage 10 until the stud 104 of specimen holder 11 pushes the micro-switch 203 of specimen stage 10. With the micro-switch 203 pushed, vacuum evacuation is started near the specimen holder in the electron microscope proper. After vacuum evacuation around a specimen has been completed, the specimen holder 11 is pushed deep into an interior. When the specimen holder 11 has been pushed into the extreme deep, the electrode group 202 of specimen stage 10 connects to the electrode group 105 of specimen holder 11. With a specimen holder communication system 308 brought into connection, information stored in the memory 303 inside the specimen holder 11 is first transferred to a CPU 309. After the information has been analyzed to decide what function the specimen holder 11 has, a specimen holder control system 307 feeds power to the specimen holder drive system 305 inside the specimen holder 11 and transmits control signals to the specimen holder drive system 305 to activate the function of the specimen holder 11.

Figure 5:
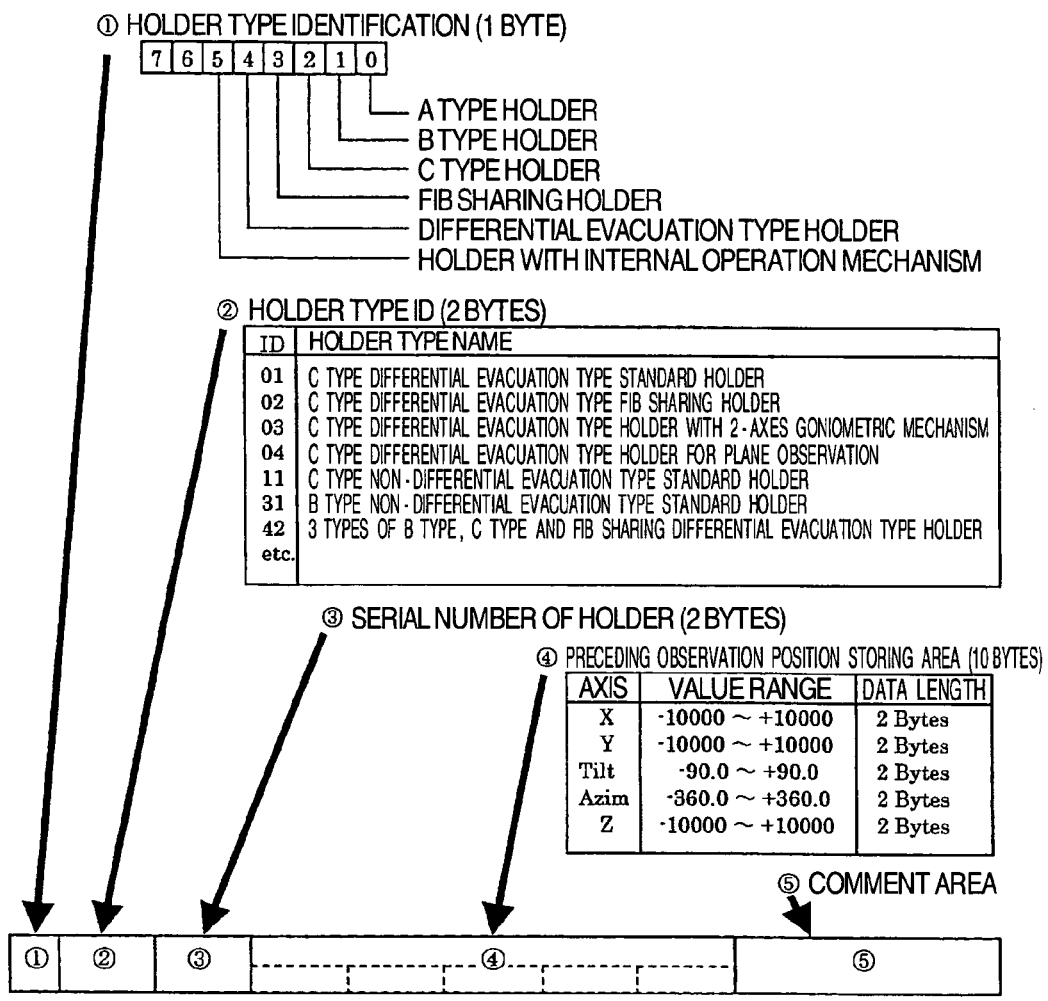
FIG. 5 is a diagram useful to explain a memory map in the specimen holder.

The information stored in the memory 303 of specimen holder 11 is structured as exemplified in FIG. 5. A holder type identification code is set in heading 1 byte. The holder is lengthened differently depending on the electron microscope proper to be used and holders are discriminated from each other by using distinctive types A, B and C. A bit corresponding to any one of these types is rendered 1 and the remainder is rendered 0. For a holder compatible with both the B type and the C type, the corresponding two bits are rendered 1. An FIB sharing holder is structured such that the direction of a specimen can be changed through 90° between the condition of observation with the electron microscope and the condition of working with the focused ion beam (FIB) apparatus. To identify the holder having this structure, the corresponding bit is rendered 1. For a differential evacuation type holder, the vacuum evacuation system has an intermediate evacuation chamber interposed between the specimen portion and the outside atmosphere and when this type of holder is mounted to the microscope proper, the intermediate evacuation chamber is evacuated to vacuum by means of a separate evacuation system. The external appearance of this type of holder hardly differs from that of other types but the vacuum evacuation sequence in the electron microscope proper differs and therefore this type of holder is handled distinctively from other types. A holder with internal operation mechanism needs to connect to a power supply and a control system and is therefore identified by the corresponding bit.

The second 2 bytes are for holder type ID. A variety of kinds of holders are allotted with different ID numbers holder by holder. Only 7 kinds are enumerated exemplarily in FIG. 5 but practically, the number is innumerable. The succeeding 2 bytes define an area for recording serial numbers of holders. The ensuing 10 bytes define a memory area for storing a location observed precedently in the memory of holder. Typically, either X or Y makes an entry of numerical values in a unit of 0.1 μm and Tilt makes an entry of numerical values in a unit of 0.1°. Azim (Azimuth) makes an entry of control quantities for the holder with internal operation mechanism and makes an entry of 0 in the case of a holder without internal operation mechanism. For example, in the case of a two-axes goniometric holder, Azim makes an entry of goniometric angles in β direction in a unit of 0.1°. So long as the microscope proper has the function to control the height of a specimen, Z makes an entry of numerical values but except the above, Z makes an entry of 0. The ensuing memory area defines a comment area and depending on the function of the holder, this area is utilized as a memory area in connection with the extension function.

The CPU 309 in electron microscope proper as shown in FIG. 3 uses the holder type identification and holder type ID among the data stored in the memory 303 inside the holder so as to specify the kind of the mounted specimen and impose a moving amount restriction on the specimen fine movement mechanism. The electron microscope proper has holder shape data in respect of the individual holder type ID's and restricts first tilt operation on the basis of a magnetic pole gap of an objective lens pole piece mounted at present and the corresponding holder shape data. In the event that the holder is of the holder type ID for which the electron microscope proper does not have any data of holder shape, an exceptional handling function can be started to permit the user to restrict operation by an input to this effect. Thereafter, a movement restriction in Y direction imposed when the tilt is operated is set in compliance with the operation restricted by the user.

Figure 6:
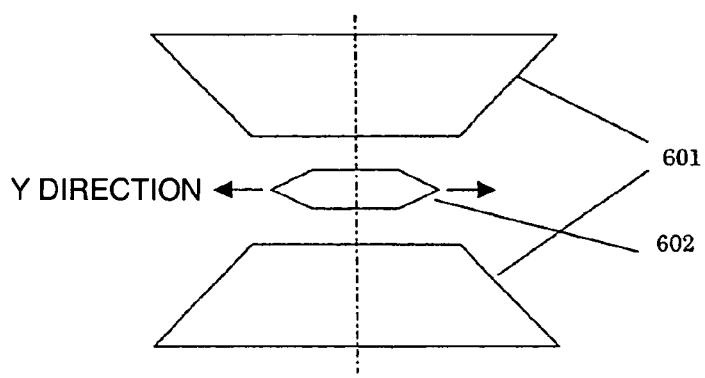
FIG. 6 is a diagram showing the neighborhood of the specimen holder being not tilted.
Figure 7:
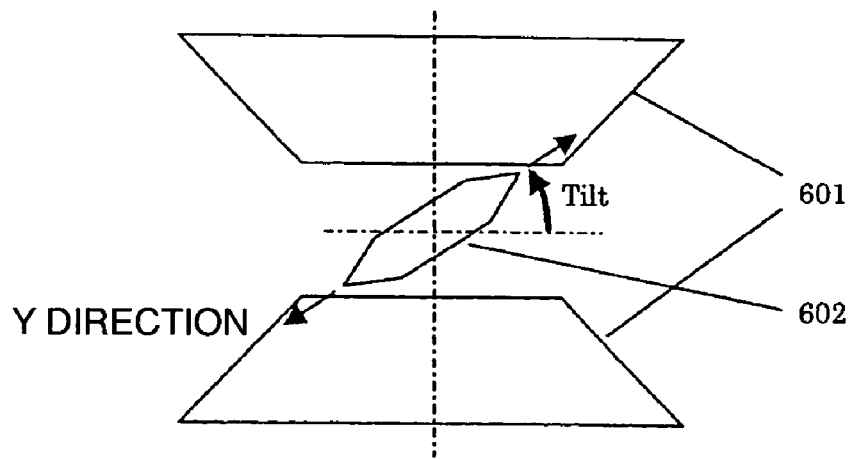
FIG. 7 is a diagram showing the neighborhood of the specimen holder being tilted.

A restriction attributable to a tilt will be described with reference to FIGS. 6 and 7. The specimen holder is pushed into a gap between upper and lower magnetic poles of a pole piece 601 constituting the objective lens. In the electron microscope, a magnetic field generated from the pole piece forms the objective lens which focuses the electron beam and therefore the specimen must be laid in the gap. The specimen holder has an external appearance 602 as shown in FIGS. 6 and 7 when viewed in a direction of tilt axis. In FIG. 6, the specimen holder is not tilted. In this condition, there is no need of restricting movement. In FIG. 7, the specimen is tilted. Since the external appearance 602 of specimen holder is larger longitudinally than the gap of pole piece 601, the specimen holder comes into contact with the pole piece 601 as the tilt angle increases, damaging the pole piece and to avoid such an event, tilting needs to be restricted. Even under the tilt restriction, the holder still comes into contact with the pole piece 601 if moved in Y direction while being tilted and hence there is need for movement of the holder to be restricted in the Y direction in accordance with the tilt angle.

If the holder type identification data is inconsistent with the holder type ID, it is conceivable that data stored in the holder is destroyed or the holder is counterfeited and therefore the CPU 303 of the electron microscope proper inhibits the holder from being moved and gives the alarm on the display unit of the electron microscope proper.

According to the present invention, the electron microscope proper can recognize which type the specimen holder now inserted belongs to and in the case of a specimen holder with internal operation mechanism, the electron microscope can automatically decide whether current is to be fed to the electrode for power feed. Unless the electron microscope recognizes any specimen holder, no current is passed through the electrode for power feed and anxiety about electrical short-circuit can be eliminated. But for preventing electrical short-circuit from taking place when the holder is drawn out suddenly, the neighborhood of the electrode group 105 must be protected by the insulator 106. In addition, with a view to preventing the electrode for feed of power supply from contacting another electrode and destroying the circuit when the specimen holder 11 is inserted ultimately, the electrode for feeding power is arranged at a site most close to the fore end of specimen holder 11.

In the example of FIG. 3, the specimen holder control system 307 is provided separately from the specimen holder communication system 308 because specifications for power used differ for these systems. Alternatively, power supply of the specimen holder communication system 308 may be fed from a battery located in the specimen holder 11. As the simplest structure of the memory 303, a pattern of conduction/non-conduction (contact signals) using a plurality of electrodes is conceivable. Communication/control can be materialized using an electromagnetic wave in lieu of contacting electrodes. In case power cannot be supplied under the control of the electromagnetic wave, power can be fed from the battery located in the specimen holder 11.

Examples of use of the specimen holder of this invention will now be described by way of example of the two-axes goniometric holder and the FID sharing holder.

The two-axes goniometric holder is a specimen holder having a specimen goniometric mechanism. Normally, the electron microscope proper has a mechanism for tilting the specimen holder in a rotary direction about the center of axis of the specimen holder. This tilting is called a tilt and in the case of two-axes goniometric holder, often called a. The specimen goniometric mechanism in the specimen holder is a mechanism for giving a specimen a tilt by turning the specimen about an axis being vertical to the specimen holder axis and parallel to the specimen surface and passing through the center of the specimen. The tilt angle in this direction is indicated as Azim and typically called β. In dismounting the two-axes goniometric holder from the electron microscope, the tilt angle must be returned to 0°. When imagining that this type of specimen holder is dismounted from the electron microscope and then the same specimen is again desired to be observed, if a preceding specimen tilt angle is stored in the memory inside the specimen holder, the user need not inscribe the tilt angle. If a position of the specimen stage is stored concurrently, quite the same observation condition as the preceding one can automatically be reproduced. In the past, in order to operate a tilt mechanism for the second axis of two-axes goniometric holder, a cable must be connected to the specimen holder. In the specimen holder of this invention, however, the second axis tilt can be given by passing current through the electrode for power feed provided in the specimen holder. In other words, the user can be freed from connecting a surplus cable.

The FIB (focused ion beam) apparatus sharing holder is so formed as to be mountable to both the FIB apparatus representing an apparatus for making a specimen a thin film and the electron microscope. How to use the FIB sharing holder will be described below. Firstly, a specimen before thin filming is mounted to the FIB sharing holder. The specimen holder is inserted into the FIB apparatus and this specimen is so worked at to be a thin film. At that time, a site at which the specimen is made to be thin is stored in a preceding observation position storing area of the memory in the FIB sharing holder. Since a position lying in Y direction in the FIB apparatus corresponds to a position lying in Z direction in the TEM or STEM, quantities X, Tilt and Z are stored in this phase. A position in Y direction is not updated in consideration of the fact that a Y location which has been used in the TEM or STEM will sometimes be reproduced. Azim is always 0 in connection with this type of holder. Thereafter, when the specimen holder is inserted into the electron microscope, the electron microscope recognizes that this specimen holder is the FIB sharing holder and automatically moves a location stored in the memory to the center of view field of the electron microscope. The user can start observation with the electron microscope without consuming time and labor for searching the location where thin filming has been completed with the FIB.

Figure 4:
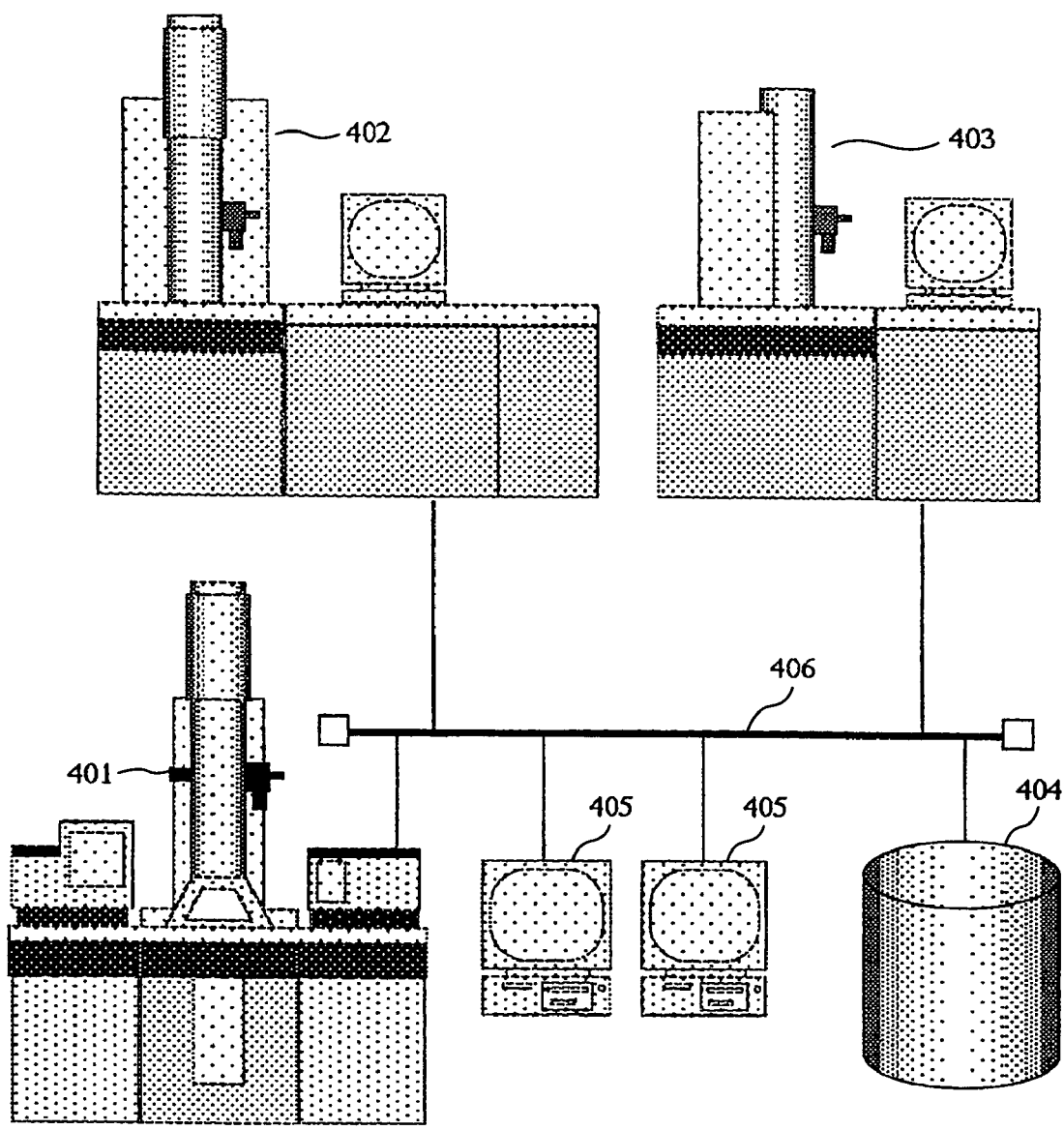
FIG. 4 is a diagram useful to explain a network connection of electron microscopes.

In case there are a plurality of apparatuses capable of using the functions of the above types of specimen holder, data pieces of specimens in the plural apparatuses can be handled collectively with ease. For collective handling of the data pieces, these apparatuses are interconnected each other through a LAN 406 as shown in FIG. 4. In an example of a system shown in FIG. 4, a transmission type electron microscope (TEM) 401, a scanning transmission electron microscope (STEM) 402, a focused ion beam (FIB) apparatus 403, a database (server) 404 and a database retrieving terminal 405 are mutually connected through the LAN 406. Holder type ID and serial number are stored in the memory 303 of the specimen holder and therefore each apparatus records acquired data along with the holder type ID and serial number and saves it in the database 404.

Procedures of process will be described in a flow starting from specimen thin filming by the FIB and ending in specimen observation and analysis.

A specimen loaded on the FIB apparatus 403 is sized so largely as to be handled by hand. A portion to be observed with the STEM is cut out of the large specimen by means of the FIB apparatus and mounted to the FIB sharing holder. The FIB apparatus forms the specimen mounted on the FIB sharing holder into a thin film observable by the STEM. When the thin filming ends, a position of the thin film and a date of thin filming completion are stored at the comment area in the memory of the FIB sharing holder. In addition to the thin filming completion date, the used holder type identification, the holder type ID and the serial number as well as the data saved in the preceding observation position storing area, an external appearance image (SIM image) of the originally largely sized specimen, a location from which a portion is cut out and information accompanying the large size specimen are stored collectively in the database 404 connected with the FIB apparatus 403.

When the FIB sharing holder is mounted to the STEM apparatus 402, the STEM 402 accesses the memory in the mounted FIB sharing holder to confirm its holder type ID and serial number and the thin filming completion date, applies a tilt angle restriction to the specimen stage and moves the specimen position on the basis of data in the preceding observation position storing area of the memory inside the FIB sharing holder. Thereafter, the user observes the specimen and acquires its image data. The image data along with the holder type ID, serial number, thin filming completion date and image data acquisition date is stored collectively in the database 404.

Subsequently, when the user applies an X-ray analysis to the same specimen as that mounted to the FIB sharing holder, obtained X-ray analysis data, acquisition date of the data and an analysis position are recorded and they are stored, also together with the information of holder type ID, serial number and thin filming completion date, in the database 404 collectively.

Regardless of times or frequencies by which the image observation and analysis are executed, the holder type ID, serial number and thin filming completion date are stored necessarily and collectively in the database 404.

Once the acquisition of data concerning the specimen has ended, the user can retrieve the holder type ID of the holder used by himself or herself, its serial number and the thin filming completion date from the data stored in the database 404 to take out all data pieces acquired by the user in an orderly adjusted fashion.

Even if thin filming, image observation and analysis of specimens are carried out by using two specimen holders at a time, different serial numbers result and the specimens and data will not be recognized indiscriminately. Further, even when a plurality of users conduct similar types of working concurrently, no misuse will take place so long as different holders are used.

When the system as shown in FIG. 4 is set up, it is also possible to find out which one of the apparatuses a specimen holder is mounted to. More particularly, by causing each of the apparatuses to transmit a holder type ID and serial number of a specimen holder now mounted and retrieving holder type ID and serial number of a wanted specimen holder from the database retrieving terminal 405, which one of the apparatuses the desired specimen is mounted to can be known.

Conceivably, a method is available according to which when a specimen is mounted, a specimen's number is stored in the comment area of memory 303 inside the specimen holder and the specimen number is recorded along with data acquired by each apparatus in the database 404.

Anyhow, data can form a data series for a specimen to facilitate later totaling.

When the TEM 401 has data of the specimen number, a study can be made in view of a correlative relation between shape observation and working of an image in the TEM. If retrieval of analysis data in the STEM 402 shows that data of the specimen is not present, a decision can be made as to whether element analysis data must be acquired additionally in connection with the specimen.

Embodiment 2

Next, a charged particle beam apparatus capable of solving a problem which arises when a specimen mounted to a specimen holder is placed in a highly intensive focusing magnetic field or electric field and the specimen holder for use in the apparatus will be described.

In the present example, a specimen is handled in accordance with the following procedures. Firstly, the specimen is mounted to the specimen holder 11. Then, the specimen holder 11 carrying the specimen is inserted into a specimen height measuring device, not shown, for measuring the height of the specimen. In the specimen height measuring device, a laser beam, for instance, is irradiated onto the specimen surface and reflection light from the specimen is detected to measure a height of the specimen surface.

The present embodiment will be described by way of example of the height measurement based on laser beam irradiation but this is not limitative and the height may be measured using another type of light source or another type of height measuring device.

The specimen height measuring device is provided with electrode terminals, not shown, and with the specimen holder 11 mounted to the device, the electrode terminals connect to the electrode group 105 on the specimen holder side. Information of specimen height obtained by the specimen height measuring device can be written to the specimen holder 11 via the electrode terminals.

After the height measurement by the specimen height measuring device has been completed, the specimen holder 11 is inserted into the scanning electron microscope. Like the charged particle beam apparatus set forth so far, the scanning electron microscope is also equipped with electrode terminals for read/write of information from/to the specimen holder 11. The height information measured by the specimen height measuring device is read by the scanning electron microscope and used for setting a focus condition of the objective lens. In this phase, the scanning electron microscope automatically determines a proper value of settable range of accelerating voltage and a proper value of objective lens operational range on the basis of the information stored in the specimen holder 11. According to this example, a proper focus condition can be set automatically without burdening the operator with a search for the proper focus condition.

When a focusing lens generating a very intensive focus magnetic field (for example, in-lens) is employed and the specimen mounted to the specimen holder is placed in the intensive magnetic field, a very strong lens intensity (focus current) can be set. In this case, if the height information is indefinite, there is a possibility that the electron beam will be focused twice in the objective lens and thereafter caused to reach the specimen surface. In such an event, an error in magnification will possibly be led to increase. According to the present example, erroneous setting of lens condition as above can be eliminated and reliability of the apparatus can be improved. It will be appreciated that when in the present example, at least an upper limit of proper objective lens current (in case of an electrostatic lens, an upper limit of voltage) can be set, it is possible to suppress the electron beam to focus plural times. Namely, by settling at least the upper limit of lens intensity involved in the charged particle beam illumination system, an improper lens adjustment can be avoided.

But, if a lower limit of objective lens current is made to be also settable by making full use of the specimen height information, focus adjustment work can be accomplished with ease.

Further, proper restrictions on the specimen tilt range and the specimen moving range can be set on the basis of the specimen height information to prevent the specimen from being damaged owing to an erroneous operation.

Moreover, the specimen height measuring device may have the function to measure a difference in height of the specimen and raise the alarm when the difference exceeds a predetermined range.

In the present example, the lens current range within which the bifocal condition can be avoided is calculated in relation to the specimen height in advance through electron trajectory simulation and is stored in the memory of control CPU. A lens operation range corresponding to the read specimen height information is read out of the memory to protect the current setting from exceeding the lens operation range in an operation condition regardless of the fact that the operation is automatic or manual. Since the operation condition of lens is definitely settled by a square root ratio between lens current and accelerating voltage, this ratio is stored in the memory to ensure that a lens current range can be settled at a desired accelerating voltage. According to the present embodiment, even if the focus position on the specimen surface is lost owing to the use of an intensive excitation type objective lens having a very shallow depth of focus, the possibility that the bifocal condition will be erroneously set can be avoided and the reliability of the apparatus can be improved.

Embodiment 3

Next, a third embodiment will be described. When the specimen holder has the function to apply voltage, there is danger of electrical shock in the absence of a means for detecting whether the holder is laid internally or externally of the apparatus proper in the event that high voltage is applied to the holder before the holder is not yet inserted in the apparatus proper. The present example is directed to the protective function to prevent electrical shock in such an event.

Figure 16:
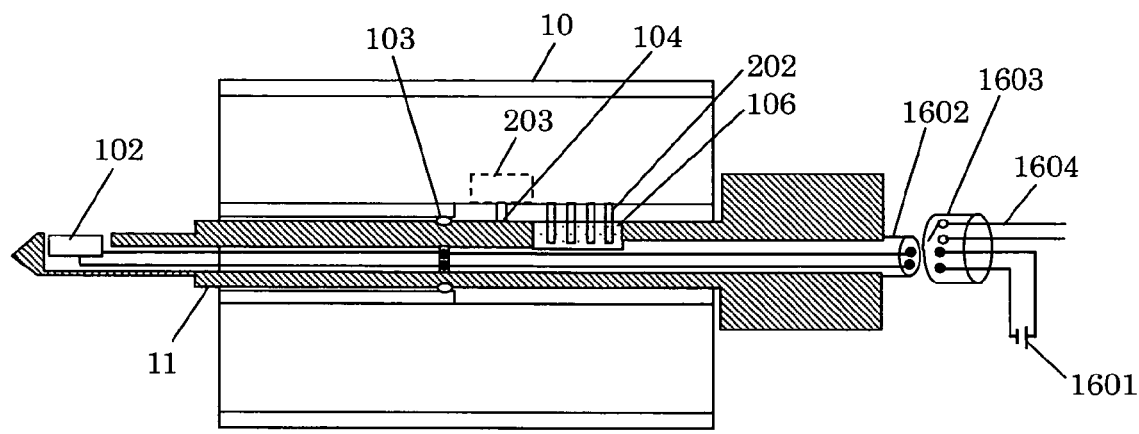
FIG. 16 is a diagram showing an example of a specimen holder with a connector admitting high voltage.

A specimen holder 11 shown in FIG. 16 is equipped with a connector 1602 for admitting a high voltage 1601 and a cable connection sensor 1604 for deciding whether a cable 1603 is connected to the connector is annexed to the specimen holder 11. Then, with the specimen holder inserted in the electron microscope, the controller of electron microscope reads a state of memory device of the specimen holder 11 to decide whether the voltage is allowed to be applied to the specimen holder and only when the cable connection sensor 1604 of specimen holder 11 is conditioned for cable connection, the application of voltage is permitted. If the cable connection sensor 1604 of specimen holder 11 does not detect the cable connection state, the controller of electron microscope prohibits the voltage application to the specimen holder 11. With the specimen holder 11 not inserted in the electron microscope, the controller of electron microscope cannot identify the memory device and in this case, the voltage application to the specimen holder 11 is forbidden, either. Advantageously, the aforementioned example functions to protect the specimen holder 11 against unconditional voltage application and the operator can be prevented from undergoing electrical shock accidentally.

Embodiment 4

Figure 9A:
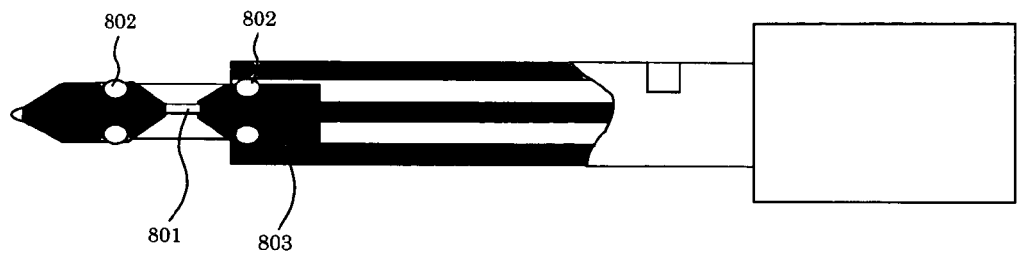
FIG. 9A is a fragmentary sectional diagram showing a specimen holder of the type for shielding an atmosphere near a specimen from the external atmosphere when the specimen holder is at one position.
Figure 9B:
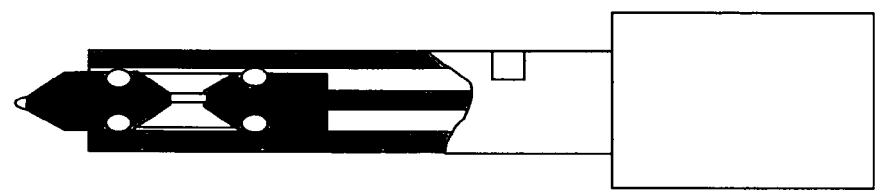
FIG. 9B is a similar diagram to FIG. 9B when the specimen holder is at another position.

An example will be described hereinafter in which an evacuation condition is stored in the memory device built in the specimen holder with a view to controlling the evacuation system of the apparatus. In the following embodiment, the evacuation system of the apparatus is controlled. Schematically illustrated in FIGS. 9A and 9B is a specimen holder of the type for shielding an atmosphere near a specimen from the external atmosphere. In mounting a specimen 801 to observe it with the SEM or SETM or work it with the FIB apparatus, the specimen holder is placed in a condition as shown in FIG. 9A. In carrying the specimen holder, a specimen supporter 803 is housed in a cylinder as shown in FIG. 9B, so that the atmosphere near the specimen 801 is kept in a specified atmosphere (for example, argon atmosphere) or in vacuum by means of two O-rings 802.

With this structure, the uppermost surface of a material which cannot be held in the atmosphere (for example, metal sodium) or of a material liable to be formed with a protection film can be worked and observed. But, when this type of holder is mounted to the charged particle beam apparatus and the specimen supporter 803 is then pushed in or pulled out, there is a possibility that the atmosphere around the specimen 801 will affect adversely the vacuum evacuation system of the charged particle beam apparatus.

Figure 10:
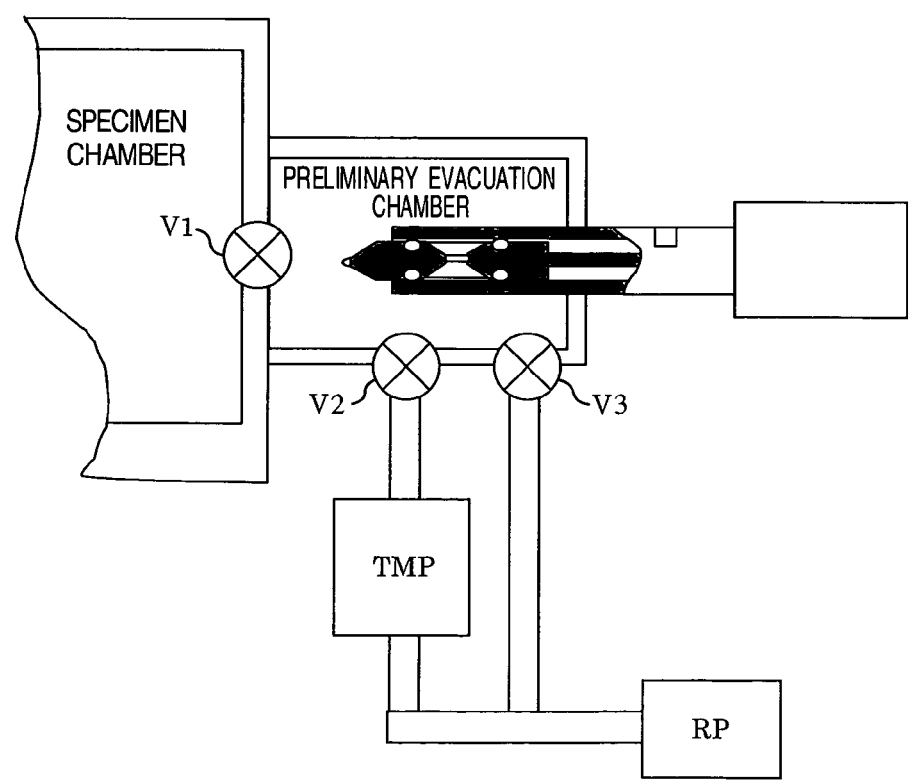
FIG. 10 is a diagram showing an example where the specimen holder shown in FIG. 9A or 9B is introduced to a preliminary evacuation chamber.
Figure 11:
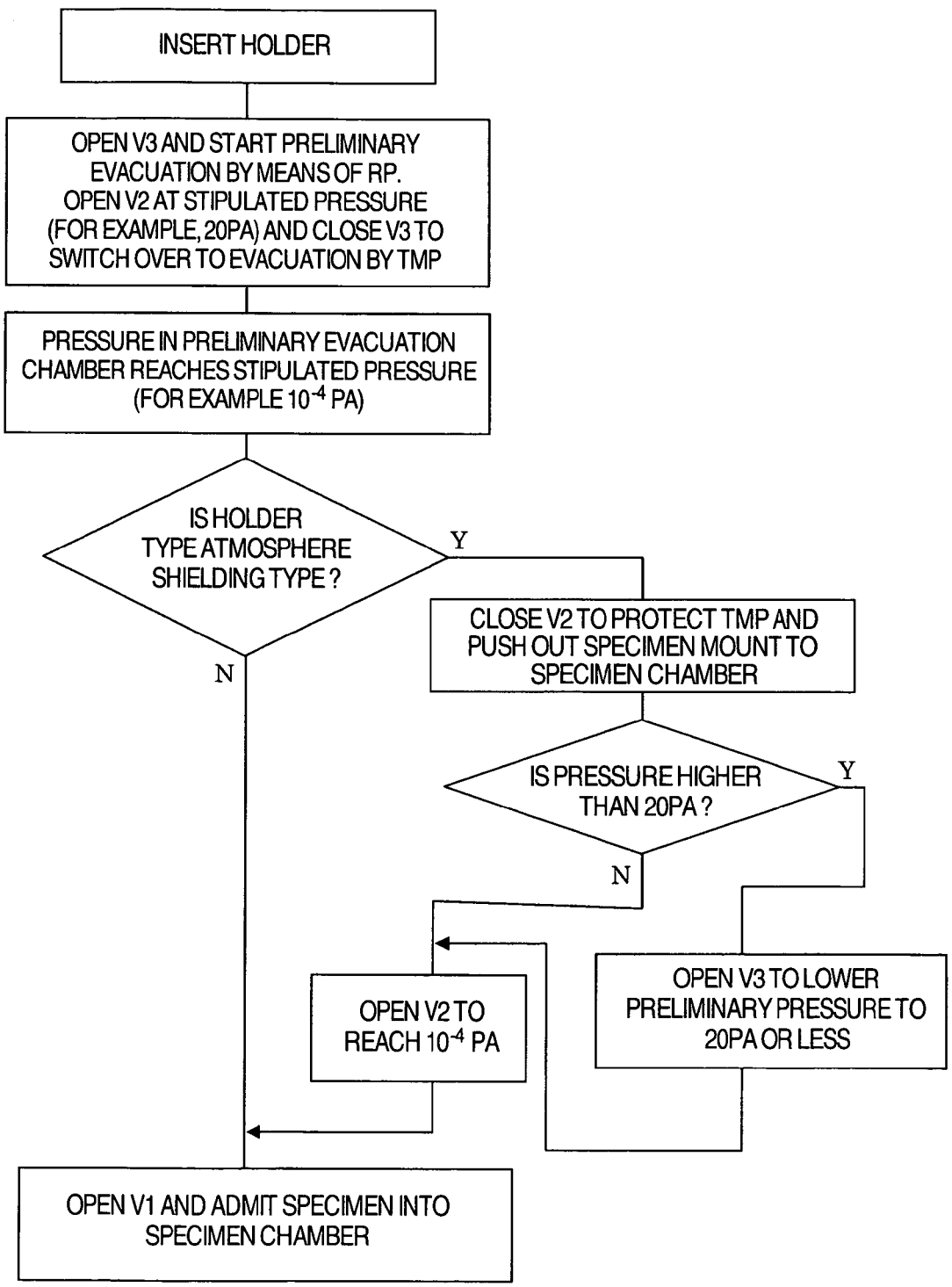
FIG. 11 is a flowchart showing the evacuation sequence when the specimen holder is introduced.

As an example, introduction of the holder of the atmosphere shielding type to an apparatus having an evacuation system as shown in FIG. 10 will be described. The evacuation sequence in this apparatus is shown in FIG. 11. Mounting of the specimen 801 to the holder of the atmosphere shielding type is carried out in an argon atmosphere in order for the specimen not to contact the air, with the result that the specimen 801 is sealed together with an argon gas. This holder led to a preliminary evacuation chamber and then a valve V3 is opened followed by preliminary evacuation by means of a rotary pump (RP). Subsequently, at the time that pressure in the preliminary evacuation chamber falls below a prescribed pressure (for example, 20 Pa), the valve 3 is closed and a valve V2 is opened to perform further evacuation by means of a turbo molecular pump (TMP).

Then, the pressure in the preliminary evacuation chamber reaches a prescribed pressure (for example, $10^{-4}$ Pa), a valve V1 blocking a specimen chamber is opened. But conceivably, there is a possibility that if the specimen supporter is pushed out in the TMP evacuated condition, the pressure in the charged particle beam apparatus rises instantaneously by dint of discharged argon gas to damage rotary blades of the TMP used for evacuation. Accordingly, it is necessary that the V2 valve be once closed to protect the V2 valve and then the specimen supporter be pushed out.

In case the pressure in the preliminary evacuation chamber increases beyond 20 Pa by dint of the discharged argon gas, the valve V3 must be reopened to restart preliminary evacuation. Conventionally, the special evacuation sequence as above has been decided by the apparatus user and executed manually. But by virtue of the specimen holder having the memory as in the present invention, at the time that the holder is inserted into the apparatus, the apparatus can recognize the type of the holder and can automatically select and execute the necessary evacuation sequence. Further, where the evacuation sequence in the charged particle beam apparatus is made to be controllable by a standardized program, a program of special evacuation sequence can be recorded in the memory inside the holder when the prescribed pressure is changed or even when a holder requiring new evacuation sequence will be developed in future, so that in any commonly usable apparatus a specimen holder can be led to the apparatus in optimum evacuation sequence without resort to consciousness of the user.

Embodiment 5

A still another embodiment of the specimen holder with memory will be described hereunder. In this example, the network shown in FIG. 4 includes, in addition to the electron microscope, a confocal laser microscope apparatus serving as specimen height measuring apparatus. The confocal laser microscope is used for measuring heights of individual portions of a specimen. On the basis of pieces of information of measured heights, a map of heights of individual portions spreading in the specimen surface direction (the height being in a direction vertical to the specimen surface direction) can be prepared. Preparation of the height map and calculation to be described later may be carried out by either a processor (controller) provided in the confocal laser microscope or another processor connected to the network shown in FIG. 4. The confocal laser microscope can transmit through a $SiO_2$ film to permit observation of wiring underlying the $SiO_2$ film.

Figure 12:
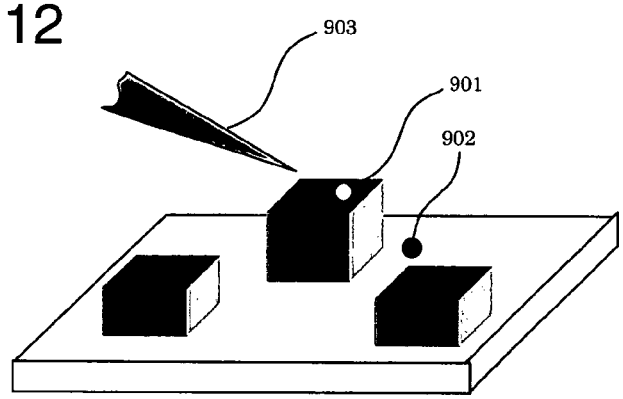
FIG. 12 is a diagram showing an example of a specimen having different levels of height.

Meritorious effects attainable by the laser microscope added to the network as above will be described below. A specimen is now imagined which is irregular in height direction as shown in FIG. 12. Supposedly, the irregularity or unevenness in height of the specimen amounts up to the order of several of 100 μm or several of mm to an extreme. Then, in the case of the scanning electron microscope, the unevenness of height is larger than the depth of focus of the charged particle beam apparatus and focusing on the overall positions of the specimen cannot be attained, so that a structure 901 situated at a higher height and a structure 902 situated at a lower height cannot be observed at a time and the intensity of the lens for focusing the charged particle beam needs to be adjusted structure by structure.

Further, in trying to pick up a fine structure portion on the specimen in the FIB apparatus with a probe mechanism, a probe 903 must be brought into contact with the fine structure portion. But the probe 903 is not postured vertically to the specimen surface and is sometimes permitted to access restricted portions only in the presence of irregular specimen heights.

For example, in trying to bring the probe into contact with the structure 902, the structure 901 at a higher height shades the structure 902 to prevent the probe from reaching the structure 902.

Accordingly, in the phase of mounting the specimen to the specimen holder, a height map of the specimen is prepared using the laser microscope. Each apparatus can make reference to this information through the network and a serial number of the holder read out of the memory of specimen holder is annexed to the height map so that information of the height map may be obtained when that specimen holder is mounted to the charged particle beam apparatus. By using the height map information, each site of the specimen can be observed at an optimum focus value with the scanning electron microscope.

When the specimen holder provided with the height map information is mounted to the FIB apparatus, the user can know a portion not contacted by the probe on the basis of the height map information.

Figure 13A:
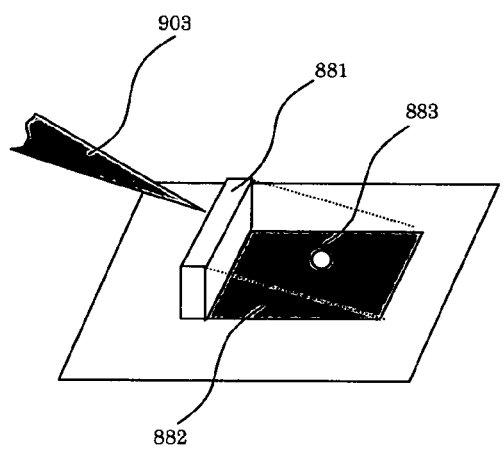
FIGS. 13A to 13D are diagrams useful to explain, on the basis of height map information, an example of specifying a site a probe cannot contact.
Figure 13B:
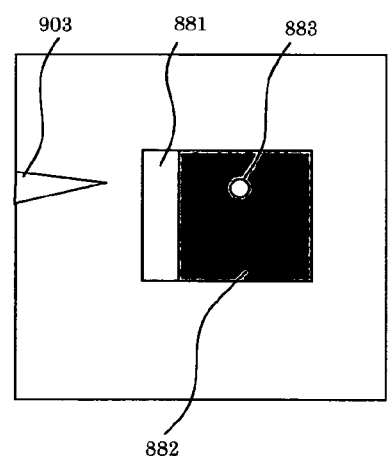

An example of specifying a site the probe cannot establish contact with on the basis of the height map information will be described with reference to FIGS. 13A to 13D. A structure is illustrated in perspective view form in FIG. 13A and an image (SIM image) of the structure observed by the FIB apparatus is illustrated in terms of the information in FIG. 13B. A structure 881 causes a portion 882 the probe cannot contact to come out, keeping the probe from coming into contact with a target site 883. The area of the portion 882 changes with the incident angle of probe and the height of structure 881 but if the height dimension is known in advance, the portion not contacted by the probe can be displayed in an overlay fashion as shown in FIG. 13B to thereby enable the user to intuitively confirm that the target site 883 cannot be contacted by the probe.

It will be appreciated that the probe non-contact portion 882 can be calculated from factors of height information of structure 881, traveling direction of probe 903 and incident or postured angle of the probe 903 to the specimen surface. For example, with the traveling direction of probe 903 settled, the contour (two sides) of probe non-contact portion 882 can be determined. Approximately, lines extending from opposite ends of the structure 881 in the traveling direction of probe 903 define the contour of two sides of probe non-contact portion 882. The remaining two sides are defined by a contour part of structure 881 and a set of points which are distant from the contour part by $a=h/\tan\theta$ in the traveling direction of probe 903, where h represents the height of structure 881 and θ represents the incident angle of probe 903 to the specimen surface. Needless to say, the size or thickness of probe 903, the tilt angle of specimen surface and the like constitute factors conducive to making a decision in the calculation. Further, when a contour is set with a margin of predetermined length leaving the contour position of probe non-contact portion 882 determined by the calculation, the influence of the collision of probe 903 with the structure 881 attributable to indeterminate factors can be prevented steadily.

Figure 13C:
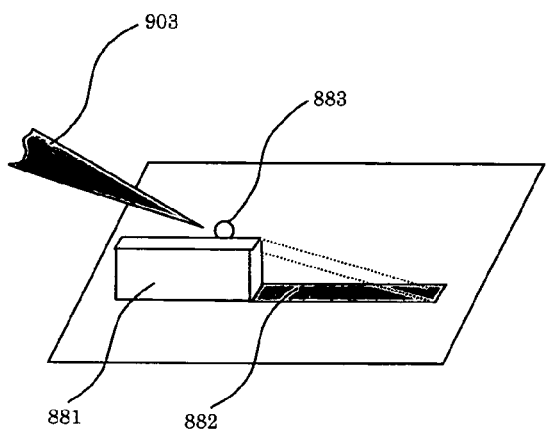
Figure 13D:
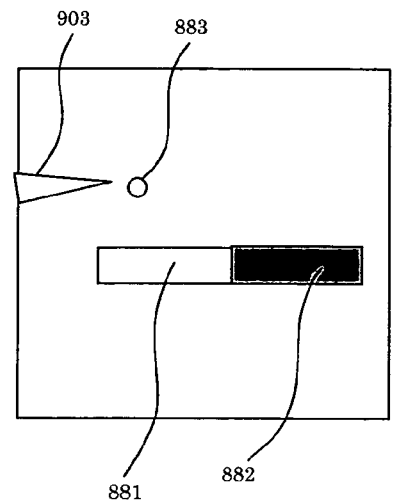
Figure 14:
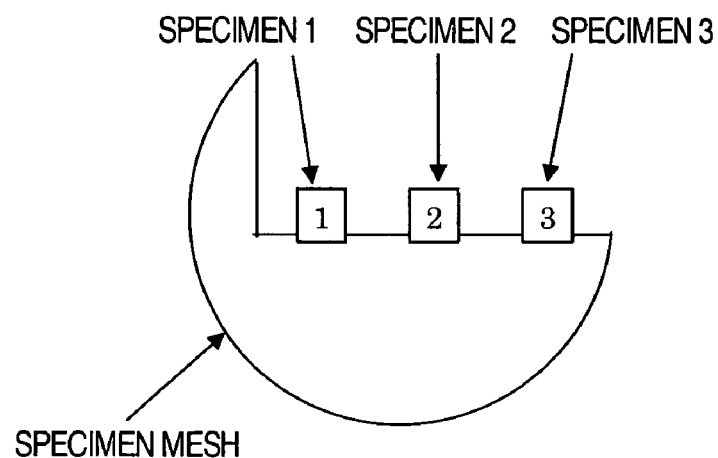
FIG. 14 is a diagram showing an example where 3 specimens are bonded to the same specimen mesh.

After getting through specifying of the probe non-contact portion 882 as above, the user rotates the specimen through, for example, 90° to enable the probe to contact the target site 883 as shown in FIG. 13C. This condition is illustrated in terms of an observation image in FIG. 13D. Display of the non-contact portion can be updated by pressing a display button. Further, by updating the display portion on the real time base, the user can afford to know intuitively the probe non-contact portion.

Conceivably, the specimen stage can be moved in Z direction on the basis of the height information in order that the height of the specimen can remain at a constant level. Through this, the probe can be allowed to come into contact with a fine structure at a site at a predetermined height level and the structure and control of the probe for sampling can be simplified.

Further, by providing the memory of specimen holder with a sufficient capacity, the information of height map can be recorded on the memory of specimen holder directly from the laser microscope. In this case, even in an apparatus not connected to the network, the specimen height can be grasped.

The laser microscope can transmit through the SiO2 film to permit observation of an underlying structure. When a specimen holder carrying a device having gotten through the laser microscope is mounted to the FIB apparatus, not only a wiring pattern on the uppermost surface of the device but also a lower wiring pattern underlying the SiO2 film can be consulted and hence working position navigation based on CAD can be carried out with high accuracies.

Embodiment 6

The position of a specimen carried on a specimen holder and detailed information of the specimen can be recorded in the memory of the specimen holder or in information related by an ID of holder stored in the memory and the thus recorded data can be utilized efficiently in various ways. Even when a plurality of specimens are carried on the holder, pieces of information corresponding in number to the specimens can be recorded to further expand the utilization.

When there are a plurality of observation sites on the same specimen mesh, different ID's are allotted to the observation sites one by one. In observation, an ID of a holder mounted to the apparatus is confirmed and how many observation sites are on a specimen now carried on the holder is confirmed. Gathering from the ID of the observation site, antecedents of the observation site are examined and the user can conduct observation and the like on the basis the resulting information.

Figure 15:
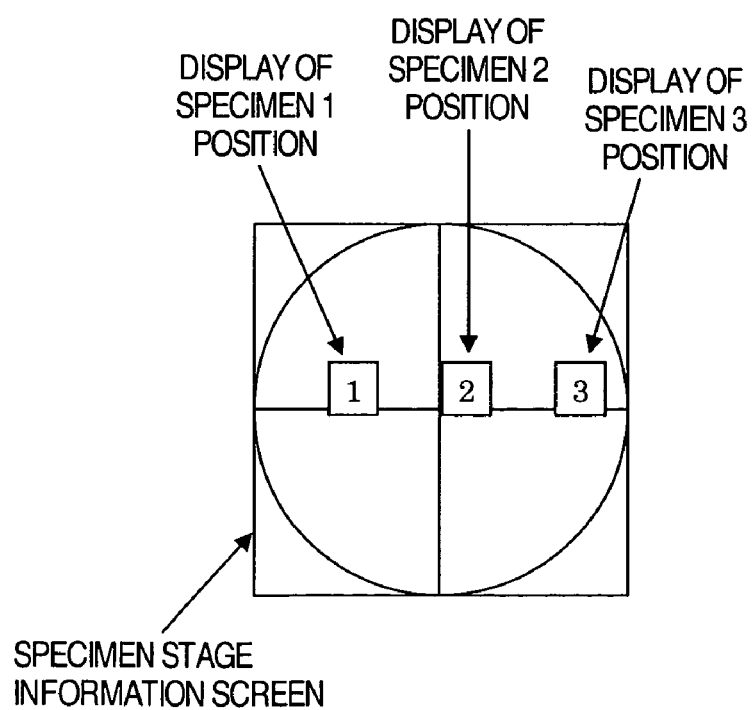
FIG. 15 is a diagram showing an example of a stage information screen.

Taking a case where 3 specimens are cut out by the FIB apparatus and bonded to the same specimen mesh at designated positions, for instance, pieces of expansion information concerning the bonded 3 specimens are recorded together with information concerning a sharing holder now used. Recorded on the expansion information are the positions of the specimens and a working condition in the FIB apparatus. Subsequently, when the holder is mounted to the TEM or STEM in order for the specimens to be observed thereby, the positions of the specimens now bonded and their ID's are displayed on the stage information screen of the TEM or STEM as shown in FIG. 15. Then, responsive to a user's choice of a specimen on the stage information screen, the specimen stage is automatically moved to the corresponding position.

If the second one of these specimens, for example, needs to be worked or processed additionally after the observation has been completed, information reading "the second specimen is to be worked additionally" is added to information managed by the memory of specimen holder or by the holder ID. Upon return of the holder to the FIB apparatus, the apparatus confirms the information reading "the second specimen is to be worked additionally" and moves automatically the specimen stage to the position corresponding to the second specimen. Since the working is done automatically, the user can be freed from time and labor for searching the additional work portion and besides other specimens than the additional work specimen can be prevented from being recognized erroneously by the user and from being damaged.

More specifically, the specimen 2 is designated on the specimen stage information screen by means of a pointing device not shown, for example, and under this condition, a cursor for designating additional work is selected. Responsive to this operation, the processor generates on the screen a window for designating an additional work condition and in the window, an apparatus condition of FIB apparatus (for example, accelerating voltage for ion beam, work position, beam current and beam diameter) may be designated.

Figure 17:
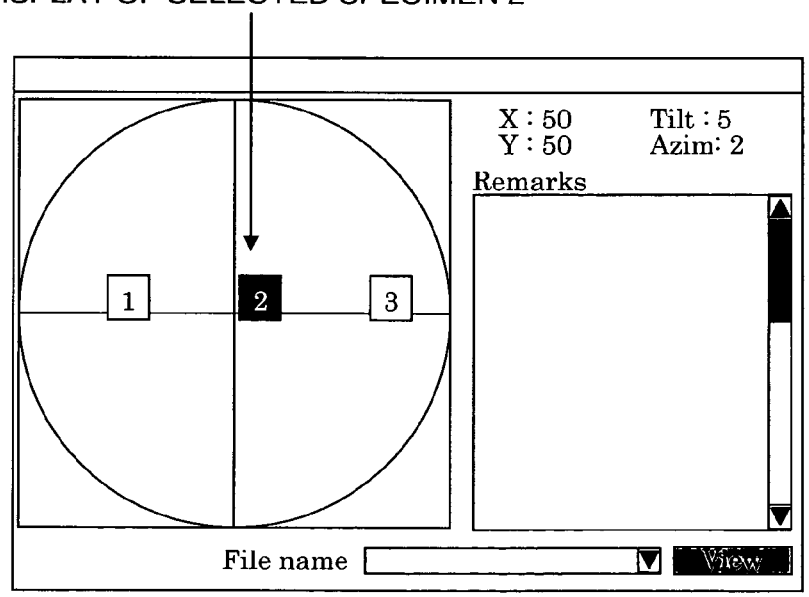
FIG. 17 is a diagram showing another example of the specimen stage information screen.

As an example, a portion on the stage information screen designated by the pointing device is changed in color as shown in FIG. 17 and information concerning the selected portion (past work condition, image file name during working and the like) is displayed at Remarks portion. When an image file name during FIB work is selected from the information in the Remark portion, the file mane is displayed at lower File name portion. By selecting a "View" button on the right side of the File name input portion, a new image display screen is opened to display an image during the FIB work.

Figure 18:
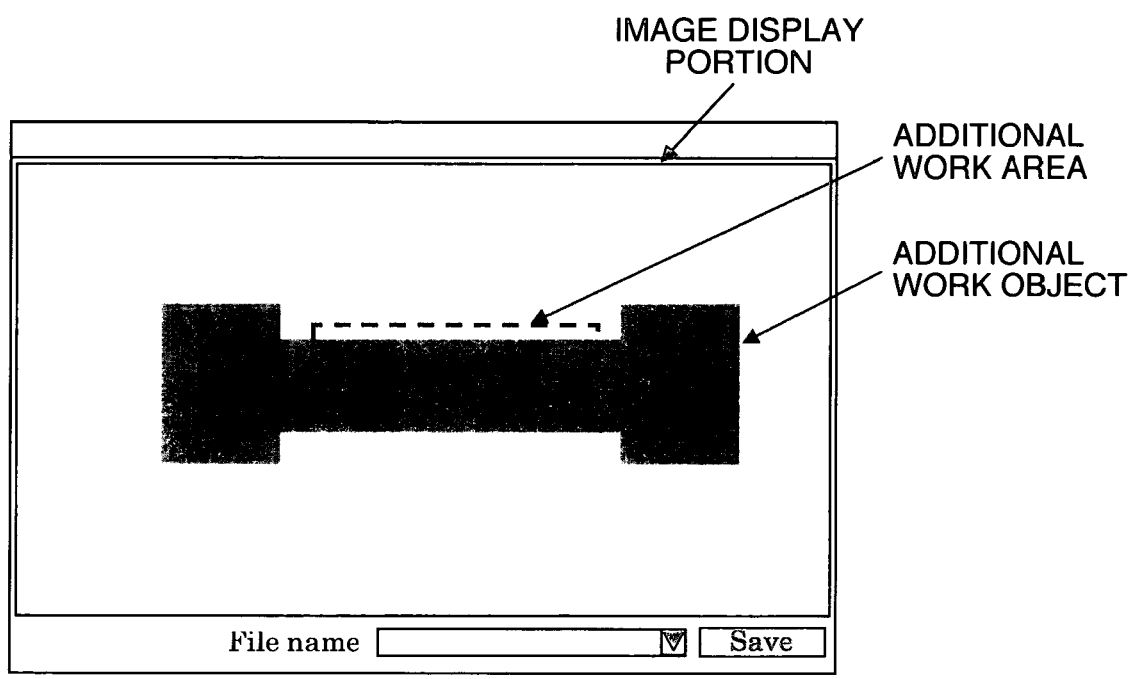
FIG. 18 is a diagram showing an example of an additional work area designating screen.

Then, as shown in FIG. 18, an additional work area is designated by using the pointing device on the newly opened screen and the designated area is saved as additional information.

Subsequently, when the specimen holder is mounted to the FIB apparatus and the stage information screen of FIB apparatus is displayed in a similar way, positions of the plurality of specimens are displayed on the screen as illustrated in FIG. 17, demonstrating that the specimen position added with the additional work information a little while ago is displayed in changed color. By designating the changed color portion by means of the pointing device, the stage is caused to move to the corresponding position and the additional work portion is displayed on an observed image. The additional work area designated in FIG. 8 is automatically set while overlapping on the observed image and preparation for FIB work is completed. As the user starts operation, the additional work is initiated.

Embodiment 7

Yet still another embodiment of the specimen holder with memory will be described hereunder. As one of special holders for use in the electron microscope, a cooling holder is available. With this type of holder, a specimen can be observed while being cooled by liquid nitrogen or liquid helium for the sake of reducing damage of the specimen due to electron beam irradiation. A precautious point to be kept in mind in the course of observation using the cooling holder is contamination, which is a phenomenon that a residual gas component prevailing in vacuum and a gas discharged from the specimen are deposited on the specimen under irradiation of the electron beam to deteriorate the image quality.

Since the specimen per se is cooled, a contaminant is deposited on the specimen more easily than on a specimen holder used at the room temperature. As mentioned above, components responsible for a cause of contamination are discharged from the specimen per se and therefore, the specimen holder is preferably evacuated for a long time before being pushed into the microscope column.

By making the cooling holder in the form of a specimen holder with memory, the cooling holder can be discriminated from other types of holder in the phase of preliminary evacuation and accordingly, the preliminary evacuation time can be set independently with ease. Completion of the preliminary evacuation may be decided either by simply setting the evacuation time or by measuring pressure in the preliminary evacuation chamber.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus having a specimen stage, a charged particle beam irradiation system for irradiating a charged particle beam on a specimen mounted to a specimen holder supported by said specimen stage and a specimen fine movement mechanism for finely moving the position or posture of the specimen, said apparatus comprising:

a specimen holder communication system for accessing a memory said specimen holder borne by said specimen stage has to read and/or write the kind of said specimen holder, a height of the specimen mounted on said specimen holder, a state of said memory or information of a plurality of specimens mounted on said specimen holder from/to said memory, a probe for picking up a fine structure portion on said specimen and a controller for preparing a map of height levels of said specimen on the basis of pieces of information of heights of said specimen, wherein said controller calculates a portion said probe cannot come into contact with on the basis of the height information of said specimen.

2. A charged particle beam apparatus according to claim 1 further comprising a controller for controlling application of voltage to said specimen holder, wherein said controller decides necessity or non-necessity of application of the voltage in accordance with a state of said memory.

3. A charged particle beam apparatus according to claim 1 further comprising an evacuation system for evacuating to vacuum a region in which said specimen holder is inserted, wherein said evacuation system selects a condition of the vacuum evacuation in accordance with the kind of said specimen holder.

4. A charged particle beam apparatus according to claim 1 further comprising means for selecting one of a plurality of specimens mounted on the specimen holder and means for setting a condition of additional work by an ion beam in respect of said selected specimen.

5. A charged particle beam apparatus according to claim 1 further comprising an evacuation system for evacuating to vacuum a region in which said specimen holder is inserted, wherein when said inserted specimen holder is a cooling holder, said evacuation system sets a preliminary evacuation time for the region in which said specimen holder is inserted so that it may be longer than a preliminary evacuation time for a specimen holder used at room temperature.

6. A charged particle beam apparatus having a specimen stage, and a charged particle beam irradiation system for irradiating a charged particle beam on a specimen mounted to a specimen holder supported by the specimen stage, said apparatus comprising:

a specimen holder communication system for accessing a memory which is mounted on the specimen holder, and a controller for controlling a focusing lens which focuses the charged particle beam, wherein the controller sets an operating range of the focusing lens corresponding to height of the specimen mounted on the specimen holder, based on reading information regarding to the height of specimen stored in the memory.

7. A charged particle beam apparatus according to claim 6 further comprising a controller for controlling application of voltage to said specimen holder, wherein said controller decides necessity or non-necessity of application of the voltage in accordance with a state of said memory.

8. A charged particle beam apparatus according to claim 6 further comprising an evacuation system for evacuating to vacuum a region in which said specimen holder is inserted, wherein said evacuation system selects a condition of the vacuum evacuation in accordance with the kind of said specimen holder.

9. A charged particle beam apparatus according to claim 6 further comprising means for selecting one of a plurality of specimens mounted on the specimen holder and means for setting a condition of additional work by an ion beam in respect of said selected specimen.

10. A charged particle beam apparatus according to claim 6 further comprising an evacuation system for evacuating to vacuum a region in which said specimen holder is inserted, wherein when said inserted specimen holder is a cooling holder, said evacuation system sets a preliminary evacuation time for the region in which said specimen holder is inserted so that it may be longer than a preliminary evacuation time for a specimen holder used at room temperature.

* * * * *